(12) United States Patent
Leng et al.

(10) Patent No.: US 10,644,074 B2
(45) Date of Patent: May 5, 2020

(54) FLEXIBLE DISPLAY PANEL AND FLEXIBLE DISPLAY DEVICE

(71) Applicant: Shanghai Tianma Micro-Electronics Co., Ltd., Shanghai (CN)

(72) Inventors: Chuanli Leng, Shanghai (CN); Yu Cai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 54 days.

(21) Appl. No.: 15/698,024

(22) Filed: Sep. 7, 2017

(65) Prior Publication Data

US 2017/0373121 A1    Dec. 28, 2017

(30) Foreign Application Priority Data

Apr. 5, 2017    (CN) .......................... 2017 1 0217722

(51) Int. Cl.
| | |
|---|---|
| *H01L 27/32* | (2006.01) |
| *H01L 51/52* | (2006.01) |
| *G09G 3/20* | (2006.01) |
| *H01L 51/00* | (2006.01) |
| *G09F 9/33* | (2006.01) |

(52) U.S. Cl.
CPC .............. *H01L 27/32* (2013.01); *G09G 3/20* (2013.01); *H01L 27/3244* (2013.01); *H01L 51/5253* (2013.01); *G09G 2380/02* (2013.01); *H01L 51/0097* (2013.01); *H01L 2251/5338* (2013.01)

(58) Field of Classification Search
CPC . H01L 27/03; H01L 51/0097; H01L 51/5253; H01L 51/5338
See application file for complete search history.

(56) References Cited

U.S. PATENT DOCUMENTS

| | | | |
|---|---|---|---|
| 9,614,168 B2 * | 4/2017 | Zhang | ................ H01L 23/4985 |
| 2014/0145161 A1 | 5/2014 | Naijo | |
| 2016/0072094 A1 * | 3/2016 | Kim | ...................... H01L 51/529 |
| | | | 315/112 |
| 2016/0155788 A1 * | 6/2016 | Kwon | ................ H01L 27/3276 |
| | | | 257/40 |

FOREIGN PATENT DOCUMENTS

| | | |
|---|---|---|
| CN | 103943788 A | 7/2014 |
| CN | 104424851 A | 3/2015 |
| CN | 104521331 A | 4/2015 |
| WO | 2008156581 A2 | 12/2008 |

* cited by examiner

*Primary Examiner* — Sharon E Payne
(74) *Attorney, Agent, or Firm* — Anova Law Group PLLC

(57) ABSTRACT

A flexible display panel and a flexible display device are provided. The flexible display panel comprises a display region and a non-display region surrounding the display region, wherein the non-display region includes a bonding area; a flexible substrate having a first surface and an opposite second surface; a light-emitting unit formed on the first surface of the flexible substrate; a first protective film formed on the second surface of the flexible substrate and covering the entire second surface of the flexible substrate, wherein the first protective film has a first side facing the flexible substrate and an opposite second side far away from the flexible substrate; and a second protective film formed on the second side of the first protective film. The flexible display panel includes at least one folding area and at least one non-folding area, and the second protective film only covers the at least one non-folding area.

18 Claims, 11 Drawing Sheets

FLEXIBLE DISPLAY PANEL AND FLEXIBLE DISPLAY DEVICE

CROSS-REFERENCES TO RELATED APPLICATIONS

This application claims the priority of Chinese Patent Application No. CN201710217722.6, filed on Apr. 5, 2017, the entire contents of which are incorporated herein by reference.

FIELD OF THE DISCLOSURE

The present disclosure generally relates to the display technology and, more particularly, relates to a flexible display panel and a flexible display device.

BACKGROUND

Flat panel display devices often include organic light-emitting diode (OLED) display panels, and liquid crystal display (LCD) panels, etc. OLED display panels are emerging as the mainstream display devices because of various advantages such as self-luminous, wide color gamut and flexibility.

A flexible OLED often employs a plastic substrate for being bendable, flexible, and foldable. In practical applications, a flexible display panel desires a substantially good flexibility, while various components inside the flexible display panel are highly desired to be not affected by the bending and folding, thereby eliminating the device failure. When the flexible display panel is being bent, the bending portion may be cracked as the stress accumulates, and the cracks may continue to expand inwards, degrading the overall performance of the flexible display panel. Thus, flexible display panels, which have a relatively large freedom to be folded and bent and, meanwhile, a relatively stable rigidity or stiffness to protect the various components inside the flexible display panel, are highly desired.

The disclosed flexible display panel and flexible display device are directed to solve one or more problems set forth above and other problems.

BRIEF SUMMARY OF THE DISCLOSURE

One aspect of the present disclosure provides a flexible display panel. The flexible display panel comprises a display region and a non-display region surrounding the display region, wherein the non-display region includes a bonding area; a flexible substrate having a first surface and an opposite second surface; a light-emitting unit formed on the first surface of the flexible substrate; a first protective film formed on the second surface of the flexible substrate and covering the entire second surface of the flexible substrate, wherein the first protective film has a first side facing the flexible substrate and an opposite second side far away from the flexible substrate; and a second protective film formed on the second side of the first protective film. The flexible display panel includes at least one folding area and at least one non-folding area, and the second protective film only covers the at least one non-folding area.

Another aspect of the present disclosure provides a flexible display device comprising a flexible display panel. The flexible display panel comprises a display region and a non-display region surrounding the display region, wherein the non-display region includes a bonding area; a flexible substrate having a first surface and an opposite second surface; a light-emitting unit formed on the first surface of the flexible substrate; a first protective film formed on the second surface of the flexible substrate and covering the entire second surface of the flexible substrate, wherein the first protective film has a first side facing the flexible substrate and an opposite second side far away from the flexible substrate; and a second protective film formed on the second side of the first protective film. The flexible display panel includes at least one folding area and at least one non-folding area, and the second protective film only covers the at least one non-folding area.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1A:
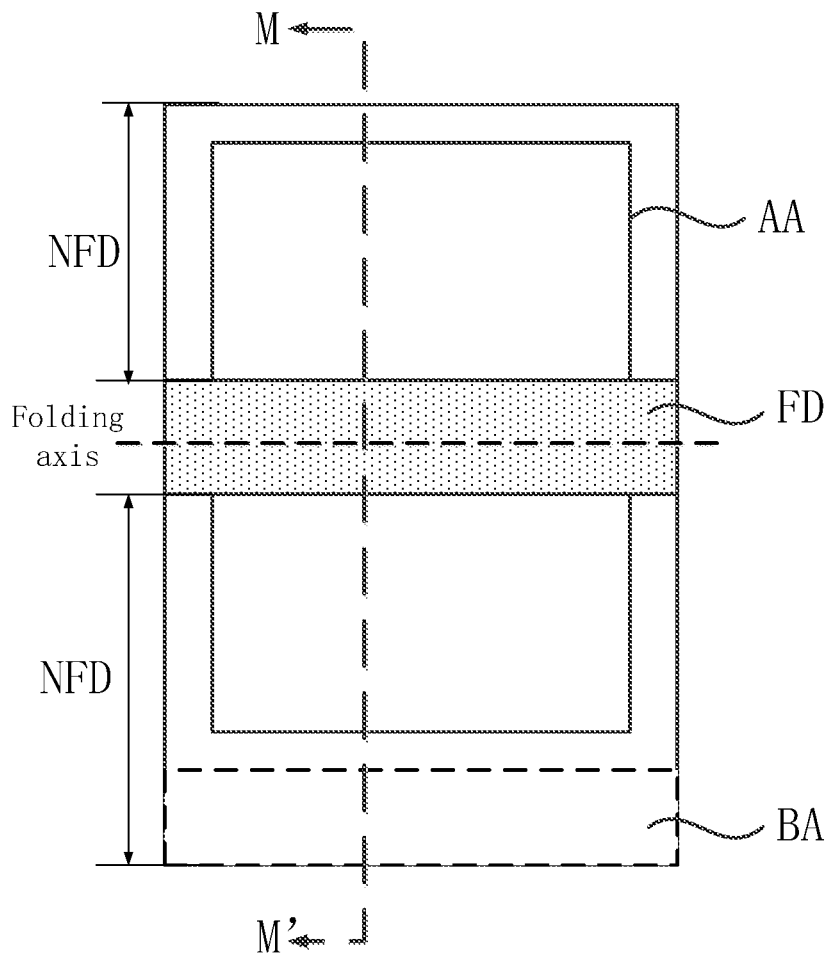
FIG. 1a illustrates a top view of an exemplary flexible display panel consistent with disclosed embodiments.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Throughout the specification, while such terms as "first," "second," etc., may be used to describe various components, such components must not be limited to the above terms. The above terms are used only to distinguish one component from another. Also, a singular form may include plural forms, unless there is a particular description contrary thereto.

Throughout the specification, terms such as "comprise" or "comprising" are used to specify existence of features and/or components described in the specification, not excluding the existence of one or more other features and/or one or more other components. It will be understood that when a layer, an area, a component, or the like is referred to as being "on" another layer, area, or component can be directly on another layer, area, or component or intervening layer, area, or component may also be present.

In the drawings, the thicknesses of layers and regions are exaggerated for clarity. For example, the thicknesses and sizes of elements in the drawings are arbitrarily shown for convenience of description and, thus, the spirit and scope of the described technology are not necessarily defined by the drawings.

Hereinafter, in one or more exemplary embodiments, X-axis, Y-axis, and Z-axis may not be limited to three axes on a rectangular coordinate system but may be interpreted as a broad meaning including the three axes. For example, the X-axis, Y-axis, and Z-axis may be perpendicular to each other or may indicate different directions that are not perpendicular to each other.

Also, it should also be noted that in some alternative implementations, the steps of all methods described herein may occur out of the order. For example, two steps illustrated in succession may in fact be executed substantially concurrently or the two steps may sometimes be executed in the reverse order.

As used herein, the term "and/or" includes any and all combinations of one or more of the associated listed items. Expressions such as "at least one of," when preceding a list of elements, modify the entire list of elements and do not modify the individual elements of the list. In the present disclosure, the term "substantially" includes the meanings of completely, almost completely or to any significant degree under some applications and in accordance with those skilled in the art. Moreover, "formed, disposed or positioned over" can also mean "formed, disposed or positioned on." The term "connected" includes an electrical connection.

The present disclosure will be described in detail with reference to the accompanying drawings. The present disclosure provides an improved flexible display panel having good bending performance and capable of protecting the internal components of the flexible display panel from bending damage.

Figure 1B:
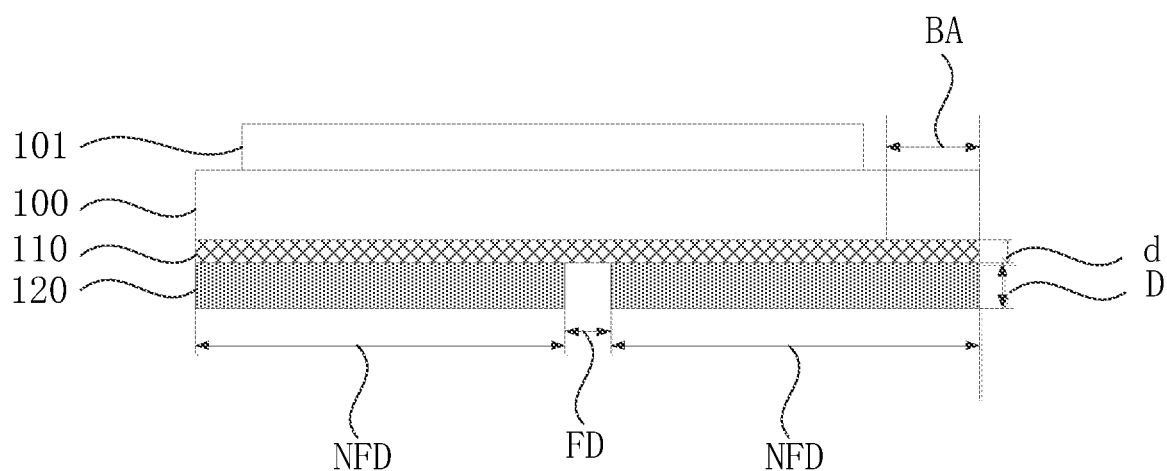
FIG. 1b illustrates an MM'-sectional view of an exemplary flexible display panel in FIG. 1a consistent with disclosed embodiments.

FIG. 1a illustrates a top view of an exemplary flexible display panel consistent with disclosed embodiments. FIG. 1b illustrates an MM'-sectional view of an exemplary flexible display panel in FIG. 1a consistent with disclosed embodiments.

As shown in FIG. 1a and FIG. 1b, the flexible display panel may include a display region AA and a non-display region surrounding the display region AA; a flexible substrate 100 having a first surface and an opposite second surface; a light-emitting unit 101 formed on the first surface of the flexible substrate 100; a first protective film 110 formed on the second surface of the flexible substrate 100 and covering the entire second surface of the flexible substrate 100; and a second protective film 120 formed on the first protective film 110.

The non-display region may be a region other than the display region AA in FIG. 1a), and the non-display region may include a bonding area BA. The first protective film 110 may have a first side facing the flexible substrate 100 and an opposite second side far away from the flexible substrate 100, and the second protective film 120 may be formed on the second side of the first protective film 110.

In particular, the flexible display panel may include at least one folding area FD and at least one non-folding area NFD. The second protective film 120 may only cover the non-folding area NFD, while the first protective film 110 may cover both the folding area FD and the non-folding area NFD.

The flexible display panel may be a plasma flexible display panel, a field emission flexible display panel, a light-emitting diode (LED) flexible display panel, an organic light-emitting diode (OLED) display panel, a liquid crystal flexible display panel, a quantum dots (QDs) flexible display panel, an electrophoretic flexible display panel, etc. Further, the flexible display panel may include any appropriate type of flexible display panels capable of displaying videos and/or images.

In one embodiment, the flexible display panel may be an organic light-emitting diode (OLED) display panel, which is a self-light-emitting device. The OLED flexible display panel may include an array substrate for driving the flexible display panel to emit light. The array substrate may be formed by disposing a thin-film-transistor (TFT) array on a flexible substrate, and light-emitting units may be formed on the array substrate. The display region AA of the flexible display panel may be configured for displaying images, and the region other than the display region AA may be the non-display region. The non-display region may include various driving circuits for driving various components in the display region AA to display images and connection lines.

The non-display region may include the bonding area BA. As shown in FIG. 1a, the bonding area BA may be disposed close to one border of the display panel. The bonding area BA may be disposed with an integrated chip and a flexible printed circuit (FPC), and may be configured to bind the integrated chip and the FPC.

It should be noted that, the flexible substrate 100 may have a flexibility, thereby being stretchable, foldable, bendable or rollable. Accordingly, the flexible display panel may be stretchable, foldable, bendable or rollable. The flexible substrate 100 may be formed of any appropriate insulating materials having a flexibility, such as polyimide (PI), polycarbonate (PC), polyethersulfone (PES), polyethylene terephthalate (PET), polyethylene naphthalate (PEN), polyarylate (PAR), and glass fiber reinforced plastic (FRP), etc. The flexible substrate 100 may be transparent, translucent or opaque.

A TFT array including a plurality of TFTs may be formed on the flexible substrate 100. Each TFT may include a semiconductor active layer, a gate electrode, a source electrode, a drain electrode, and insulating layers (not shown in FIGS. 1a-1b) disposed between the electrodes. The semiconductor active layer may include a source region and a drain region formed by doping N-type impurity ions or P-type impurity ions. The region between the source region and the drain region may be a channel region without being doped with impurity ions.

Figure 2:
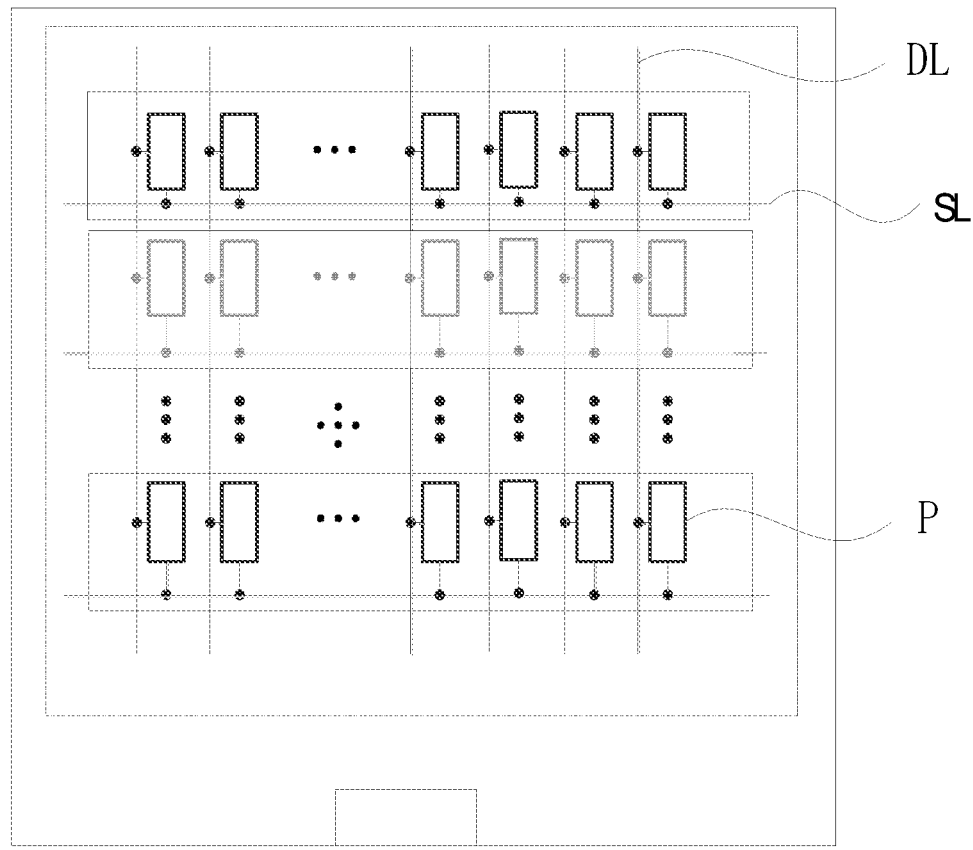
FIG. 2 illustrates a top view of another exemplary flexible display panel consistent with disclosed embodiments.

Further, the flexible display panel may also include a plurality of signal lines, and a corresponding structure is shown in FIG. 2. FIG. 2 illustrates a top view of another exemplary flexible display panel consistent with disclosed embodiments.

As shown in FIG. 2, the flexible display panel may also comprise a plurality of pixel units P, a plurality of scanning lines SL, and a plurality of data lines DL. Each pixel unit P may include a pixel circuit formed by at least one TFT and at least one capacitor. For example, each pixel unit P may include a pixel circuit formed by two TFTs and one capacitor, or include a pixel circuit formed by seven TFTs and one capacitor. The number of TFTs and capacitors are not limited by the present disclosure.

The scanning lines SL may intersect or cross the data lines DL to define the plurality of pixel units P. The scanning line SL may have one end electrically connected to the gate electrode of the TFT, and another end electrically connected to a gate controller which controls the turn-on and turn-off of the TFT. The data line DL may have one end electrically connected to the source electrode or the drain electrode of the TFT, and another end electrically connected to the integrated chip, which supplies a data signal to the light-emitting unit.

It should be noted that, the number of the scanning lines SL and data lines DL in FIG. 2 is for illustrative purposes, and is not intended to limit the scope of the present disclosure.

Returning to FIG. 1a and FIG. 1b, the light-emitting unit 101 may be formed on the TFT array. In the OLED display panel, the light-emitting unit 101 may include an anode, a cathode, and a light-emitting layer sandwiched between the anode and the cathode. When the current passes through the anode and the cathode, holes and electrons are respectively generated in the anode and the cathode, then recombined in the light-emitting layer, thereby emitting light.

An encapsulation layer (e.g., a thin film encapsulation layer) disposed on the light-emitting unit 101 may protect the light-emitting layer and other layers from external moisture and oxygen. The thin film encapsulation layer may include a plurality of stacked inorganic layers and organic layers. For example, the thin film encapsulation layer may include an organic layer sandwiched between two inorganic layers, or include a plurality of organic layers and a plurality of inorganic layers alternately arranged.

The flexible substrate 100 having a first surface facing the flexible substrate 100 having a first surface and an opposite second surface far away from the flexible substrate 100, and the protective films may be disposed on the second surface of the flexible substrate 100. On one hand, the protective film may include an organic material for protecting the flexible substrate, on the other hand, the protective film may have a composite structure of multilayer films. The protective film may be attached to the flexible substrate through an adhesive, thereby preventing the flexible substrate from being damaged by external stress or scratches.

In the disclosed embodiments, the first protective film 110 and the second protective film 120 may be disposed on the second surface of the flexible substrate 100. The materials of both the first protective film 110 and the second protective film 120 may include organic materials capable of protecting and supporting the flexible display panel, for example, at least one of polyethylene terephthalate, polyethylene naphthalate and polyethylene. The first protective film 110 and the second protective film 120 may be flexible, thus ensuring the flexibility of flexible display panel.

Referring to FIG. 1a and FIG. 1b, the flexible display panel may include at least one folding area FD and at least one non-folding area NFD. The flexible display panel may be able to be folded or bent in the folding area FD, while the non-folding area NFD may be a region other than the folding area FD. It should be noted that, the non-folding area NFD may be a region in which the flexible display panel has a smaller flexibility than in the folding area FD, rather than a region without any flexibility. That is, the flexible display panel may have a smaller bending radius of curvature in the folding area FD than in the non-folding area NFD.

FIG. 1a shows that the folding area FD may be arranged across the flexible display panel along a folding or bending axis, which is for illustrative purposes and is not intended to limit the scope of present disclosure. In particular, the position and shape of the folding area FD may be determined according to various applications. That is, the folding area FD may be arranged in any appropriate positions of the flexible display panel, through which the local flexibility and rigidity of the flexible display panel may be adjusted as desired.

In particular, the first protective film 110 may cover the entire flexible substrate 100. That is, the first protective film 110 may fully protect the entire flexible substrate 100, and prevent the flexible substrate from being damaged by external stress. The first protective film 110 has a first side facing the flexible substrate 100 and an opposite second side far away from the flexible substrate 100, and the second protective film 120 may be formed on the second side of the first protective film 110.

In particular, the second protective film 120 may only cover the non-folding area NFD. That is, the folding area FD of the flexible substrate 100 may be only covered by the first protective film 110, and the first protective film 110 in the folding area FD may not be covered by the second protective film 120. Thus, in the folding area FD, the flexible substrate 100 may be protected by the first protective film 110 and, meanwhile, exhibit a larger flexibility in the folding area FD than in the non-folding area NFD. In the non-folding area NFD, the flexible substrate 100 may be protected by both the first protective film 110 and second protective film 120, such that the flexible substrate 100 may be further protected in the non-folding area NFD, and, meanwhile, exhibit a larger rigidity in the non-folding area NFD than in the folding area FD.

Figure 3A:
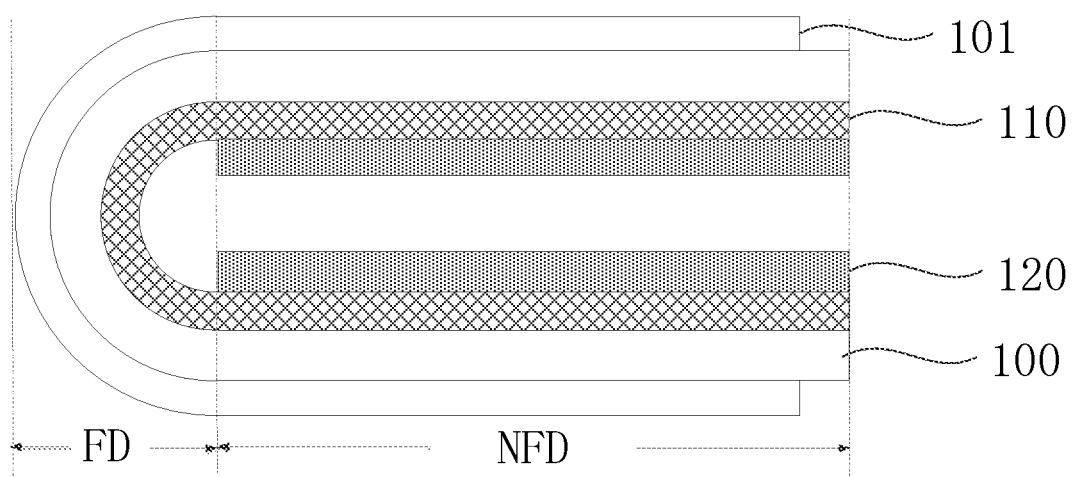
FIGS. 3a-3b illustrate an exemplary flexible display panel having an outward bending and an inward bending.
Figure 3B:

FIGS. 3a-3b illustrate an exemplary flexible display panel having an outward bending and an inward bending consistent with disclosed embodiments. The flexible display panel may have a first side where the images are displayed and an opposite side. That is, the first side may be facing the viewers, named as an image displaying side or image display surface. In the disclosed embodiments, the inward bending may be referred to a bending towards the image displaying side of the flexible display panel, and the outward bending may be referred to a bending towards the opposite side of the flexible display panel.

As shown in FIGS. 3a and 3b, when an external force is applied to the flexible display panel, the entire flexible display panel may be first deformed in the folding area FD, thereby realizing the bending in a fixed area. That is, once the folding area FD is determined according to the user demand, the flexible display panel may be able to be bent in the determined folding area FD.

It should be noted that, in the disclosed embodiments, the flexible display panel may include the first protective film 110 and the second protective film 120, which are two individual protective films and are different from a single protective film having different thickness in different regions of the single protective film. That is, the flexible display panel has a dual-protective-film structure, which is different from a single-protective-film structure having different thickness in different regions. The dual-protective-film structure may be realized by simply attaching one protective film to the other protective film, while the single-protective-film structure having different thickness in different regions may have to be realized by substantially complicated process, such as photolithotroph.

Further, the first protective film 110 may have different film properties from the second protective film 120. The first protective film 110 may be desired to provide substantially good flexibility and protection, while the second protective film 120 may be desired to provide a substantially good support and protection. Thus, through controlling the material, elastic modulus, and thickness of each of the first protective film 110 and the second protective film 120, the local flexibility and rigidity of the flexible display panel may be adjusted as desired, and a desired protection and flexibility of the flexible display panel may be realized simultaneously, which may not be simply realized by a single protective film having different thickness in different regions.

To optimize the respective desired functions of the first and second protective films, the thickness D of the second protective film 120 may be configured to be larger than the thickness d of the first protective film 110. In one embodiment, the thickness d of the first protective film 110 may be configured to be approximately 10 μm to 30 μm, and the thickness D of the second protective film 120 may be configured to be approximately 50 μm to 100 μm. Thus, when the first protective film 110 and the second protective film 120 may be made from the same material, the non-folding area NFD may be configured to be less flexible than the folding area FD through merely adjusting the thickness of the respective films, allowing the non-folding area NFD to provide a better device protection while allowing the folding area FD to provide a better flexibility.

In another embodiment, the first protective film 110 and the second protective film 120 may be made from different materials.

Further, the second protective film 120 may be configured to have a larger elastic modulus than the first protective film 110. In one embodiment, the elastic modulus of the first protective film 110 may be configured to be approximately 100 Mpa to 10 Gpa, and the elastic modulus of the second protective film 120 may be configured to be approximately 1 Gpa to 20 Gpa. According to the formula of the elastic modulus and the stress, when the same external force is respectively applied to the non-folding area NFD and the folding area FD, the folding area FD may experience a larger stress because the folding area FD is merely covered by the first protective film 110 with a smaller elastic modulus, while the non-folding area NFD may experience a smaller stress because the non-folding area NFD is also covered by the second protective film 120 with a larger elastic modulus in addition to the first protective film 110. That is, the folding area FD may be easier to be bent than the non-folding area NFD. Thus, the local flexibility and rigidity of the flexible display panel may be adjusted as desired.

It should be noted that, the shape of the folding area FD is not limited by the present disclosure. In practical applications, the position and shape of the folding area FD may be determined according to various application scenarios. That is, the folding area FD may be arranged in any appropriate positions of the flexible display panel as desired. For example, the folding area FD may be arranged across the flexible display panel in a first direction, and the first direction may be located in a same plane as the flexible display panel.

Figure 4:
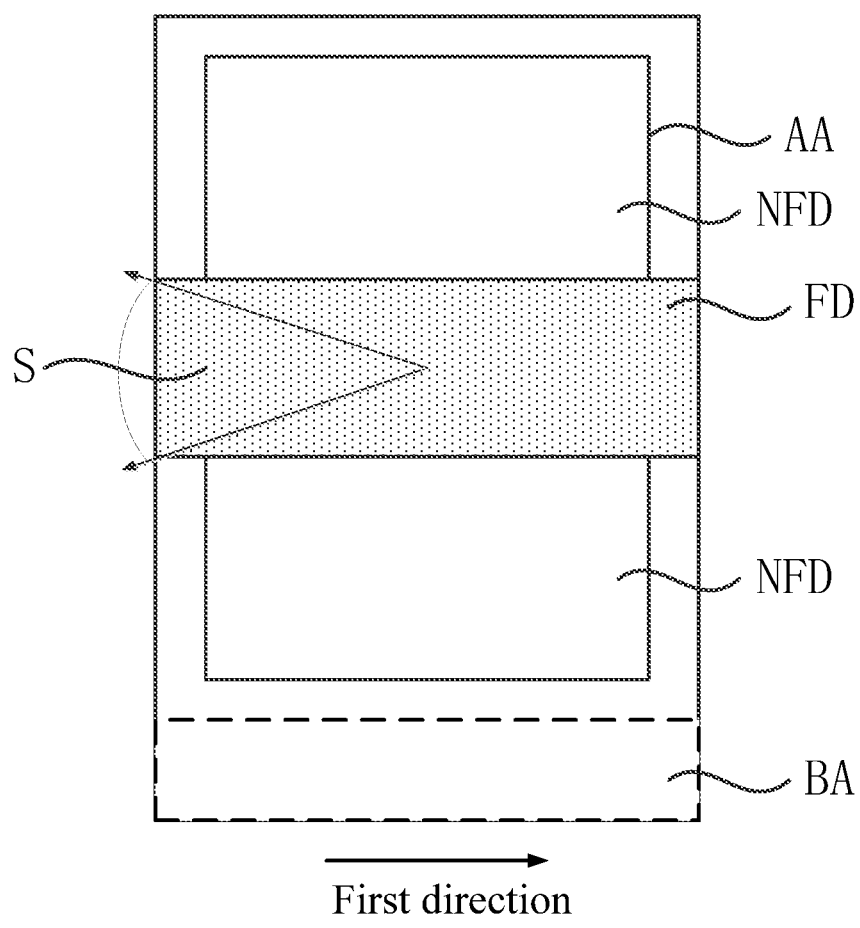
FIG. 4 illustrates a top view of another exemplary flexible display panel consistent with disclosed embodiments.

FIG. 4 illustrates a top view of another exemplary flexible display panel consistent with disclosed embodiments. The similarities between FIG. 4 and FIG. 1a are not repeated here, while certain differences may be explained.

As shown in FIG. 4, the folding area FD may be arranged across the flexible display panel in a first direction. FIG. 4 shows the first direction for illustrative purposes.

The folding area FD may be arranged across the flexible display panel simultaneously in a plurality of directions. In one embodiment, as shown in FIG. 4, any directions within a sector S may be considered to be the first direction, such that the flexible display panel may be able to be bent or folded in the fixed region (i.e., the folding region FD), stratifying the bending demands from different users.

Further, referring to FIG. 4, the folding area FD may have a regular shape, such as a rectangle shape. When the folding area FD has a regular rectangle shape, the flexible display panel may be well folded in a specific direction as desired by the user. That is, a free deformation of the flexible display panel may be suppressed, thereby further facilitating the fabrication process of the second protective film.

The position and shape of the folding area FD may depend on the second protective film and, thus, the folding area FD may be determined by adjusting the position and shape of the second protective film as desired, which may increase the flexibility of the fabrication process.

In one embodiment, the first direction may be the same as the extending direction of the gate line of the flexible display panel, and in the rectangular folding area FD, one side of the rectangle may extend in the first direction, such that the flexible display panel may be folded in the extending direction of the gate line. As discussed above, the FPC electrically connected to the data line may be disposed in the bonding area BA, which is often disposed at one end of the data lines in the extending direction of the data line. The data line is often perpendicular to the gate line. Thus, through configuring the first direction of the folding area FD to be the same as the extending direction of the gate line, the various circuit elements in the bonding area BA of the flexible display panel may be prevented from being bent, and the corresponding circuit failure may be suppressed.

In one embodiment, as shown in FIGS. 1a to 1b and FIGS. 3a to 4, the flexible display panel may include one folding area FD which is disposed in the middle of the flexible display panel. That is, a non-folding area NFD may be respectively disposed at two sides of the folding area FD, in which the two sides of the folding area FD are parallel to the first direction. That is, in the direction perpendicular to the first direction, two non-folding areas NFD may be disposed adjacent to the folding area FD. For example, the non-folding areas NFD disposed at two sides of the folding area FD may have the same shape and the same area and, accordingly, the flexible display panel may be folded from the middle of the flexible display panel.

In another embodiment, the flexible display panel may include at least two folding areas FD, in which the folding areas FD and the non-folding areas NFD may be alternately arranged in a direction perpendicular to the first direction. The folding area FD may be arranged across the flexible display panel in the first direction, and the first direction may be located in a plane in which the flexible display panel is arranged. The folding area FD may have a rectangular shape. A corresponding structure is shown in FIG. 5.

Figure 5:
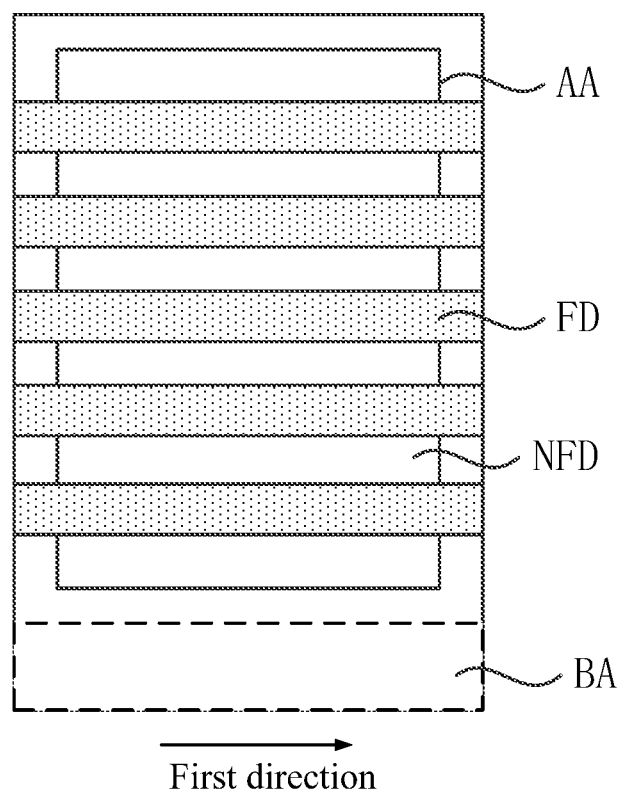
FIG. 5 illustrates a top view of another exemplary flexible display panel consistent with disclosed embodiments.

FIG. 5 illustrates a top view of another exemplary flexible display panel consistent with disclosed embodiments. The similarities between FIG. 4 and FIG. 5 are not repeated here, while certain differences may be explained.

As shown in FIG. 5, the flexible display panel may include five folding areas FD and six non-folding areas NFD, in which the five folding areas FD and six non-folding areas NFD may be alternately arranged in a direction perpendicular to the first direction. The plurality of folding areas FD in the flexible display panel may facilitate the rolling of the flexible display panel.

In an existing flexible display panel which is rollable, the rolling direction of the flexible display panel is often not fixed and, thus, the flexible display panel may experience a random rolling. That is, the flexible display panel may not be rolled in a predetermined direction because the rolling direction of the flexible display panel is often not fixed.

In the disclosed embodiments, through alternately arranging the folding areas FD and the non-folding areas NFD in the direction perpendicular to the first direction and, meanwhile, disposing the second protective film only on the non-folding areas NFD, the flexible display panel may be able to be rolled in a predetermined direction, i.e., the flexible display panel may be able to be rolled in the first direction as a rolling shaft. Meanwhile, the second protective film may provide a good support and protection in the non-folding areas NFD of the flexible display panel. Thus, the non-folding areas NFD may be disposed with the various components which are easy to be affected by the stress and, accordingly, the flexible display panel may be well protected and the device failure may be eliminated. Thus, the flexible display panel may exhibit both good flexibility and device stability.

It should be noted that, the flexible display panel shown in FIG. 5 which includes five folding areas FD and six non-folding areas NFD is for illustrative purposes and is not intended to limit the scope of the present disclosure. In practical applications, the number of the folding areas FD and the non-folding areas NFD may be determined according to various applications.

Figure 6A:
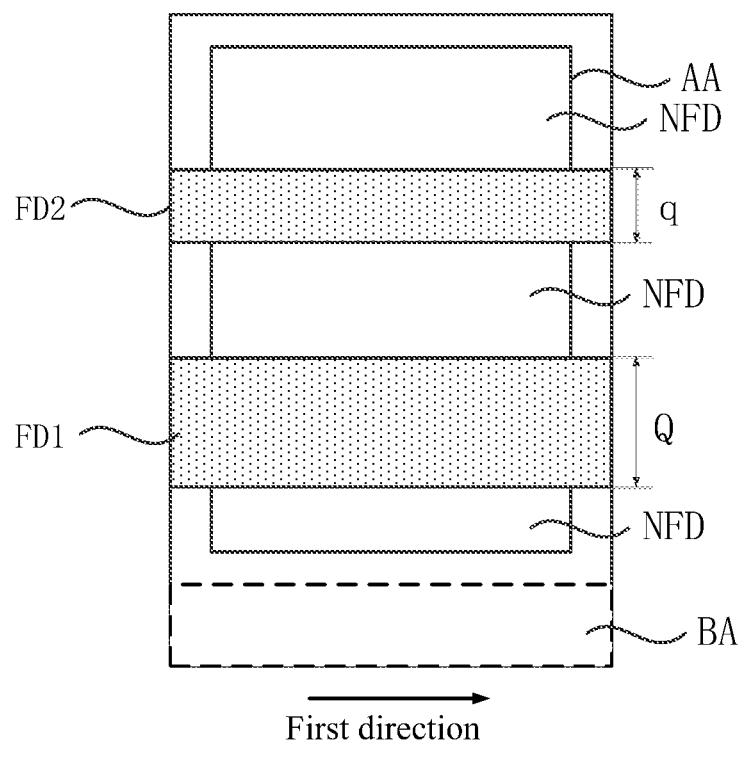
FIG. 6a illustrates a top view of another exemplary flexible display panel consistent with disclosed embodiments.
Figure 6B:
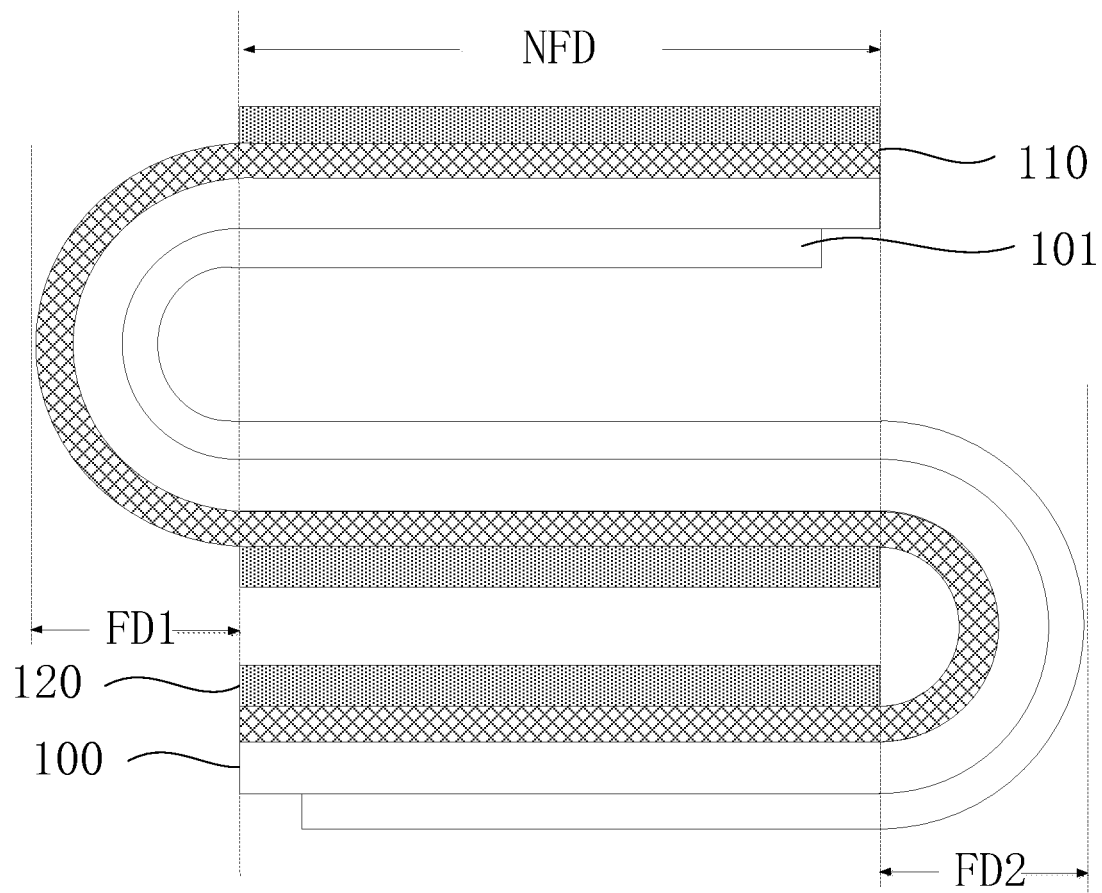
FIG. 6b illustrates a bending status of another exemplary flexible display panel in FIG. 6a consistent with disclosed embodiments.

FIG. 6a illustrates a top view of another exemplary flexible display panel consistent with disclosed embodiments, and FIG. 6b illustrates a bending status of another exemplary flexible display panel in FIG. 6a consistent with disclosed embodiments. The similarities between FIGS. 6a-6b and FIG. 5 are not repeated here, while certain differences may be explained.

As shown in FIGS. 6a-6b, the flexible display panel may include two folding areas FD1, FD2 and three non-folding areas NFD, in which the two folding areas FD and three non-folding areas NFD may be alternately arranged in a direction perpendicular to the first direction. The two folding areas FD1, FD2 may be arranged across the flexible display panel in the first direction, and each of the folding areas FD1, FD2 may have a rectangular shape. The second protective film 120 may only fully cover each non-folding area NFD. The two folding areas FD1, FD2 may have different width in the direction perpendicular to the first direction.

Referring to FIG. 6a, in the direction perpendicular to the first direction, the width of the folding area FD1 is Q, the width of the folding area FD2 is q, and Q>q. Through configuring two folding areas FD1, FD2 in the flexible display panel, the flexible display panel may be provided with dual folding axes. That is, the flexible display panel may be able to be folded twice.

FIG. 6b illustrates the flexible display panel is folded inwards and outwards at the two folding areas FD, respectively. As shown in FIG. 6a, the flexible display panel is folded inwards at the folding area FD1 and, meanwhile, folded outwards at the folding area FD2. Folding inwards indicates that the flexible display panel is folded towards the light-emitting unit 101, folding outwards indicates that the flexible display panel is folded opposite to the light-emitting unit 101. In the direction perpendicular to the first direction, the folding area FD1 may have a larger width than the folding area FD2, i.e., Q>q.

When the flexible display panel is bent outwards, the first protective film 110 and the second protective film 120 may be subjected to a substantially large tensile stress, and experience a substantially large elastic deformation. In the direction perpendicular to the first direction, through configuring the folding area FD1 to have a larger width than the folding area FD2.

It should be noted that, through providing the flexible display panel with two folding areas FD1 and FD2 having different width in the direction perpendicular to the first direction, the flexible display panel may not be only allowed to simultaneously have an inward bending at the folding area FD1 and an outward bending at the folding area FD2, but also allowed to have an inward bending at each of the folding areas FD1 and FD2, or an outward bending at each of the folding areas FD1 and FD2. Thus, the flexible display panel may be folded twice to have three stacked layers.

However, no matter the flexible display panel is bent inwards once and outwards once or bent inwards twice or bent outwards twice, one of the two folding areas FD1, FD2 may be subjected to a larger tensile stress or compressive stress than the other. Thus, the folding area subjected to a larger tensile stress or compressive stress may desire a larger elasticity than the other folding area. In the direction perpendicular to the first direction, through configuring the folding area subjected to a larger tensile stress or compressive stress to have a larger width than the other folding area, the area covered by the second protective film 120 at the folding area subjected to a larger tensile stress or compressive stress may be reduced, thereby realizing a larger elasticity at the folding area subjected to a larger tensile stress or compressive stress.

That is, in the direction perpendicular to the first direction, through configuring the folding area to have different widths at different regions than the other folding area, the elasticity at different regions of the flexible display panel may be as desired.

Further, the width of the two folding areas may be determined according to a desired bending of the flexible display panel. In one embodiment, when the flexible display panel has a bending radius of curvature of r and R in the two folding areas, respectively, the width of two folding areas may be configured to be πr and πR in the direction perpendicular to the first direction, respectively.

Figure 7A:
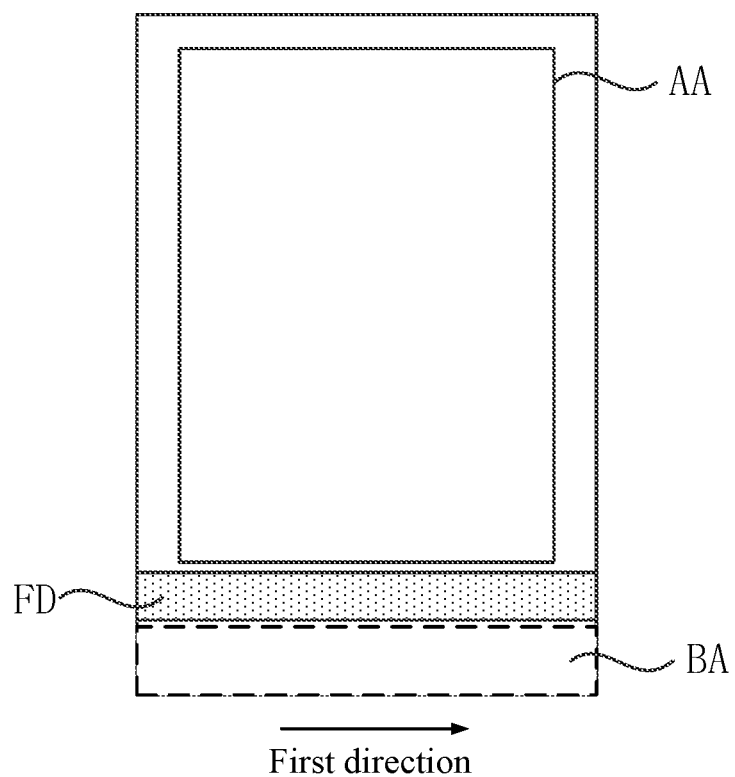
FIG. 7a illustrates a top view of another exemplary flexible display panel consistent with disclosed embodiments.
Figure 7B:
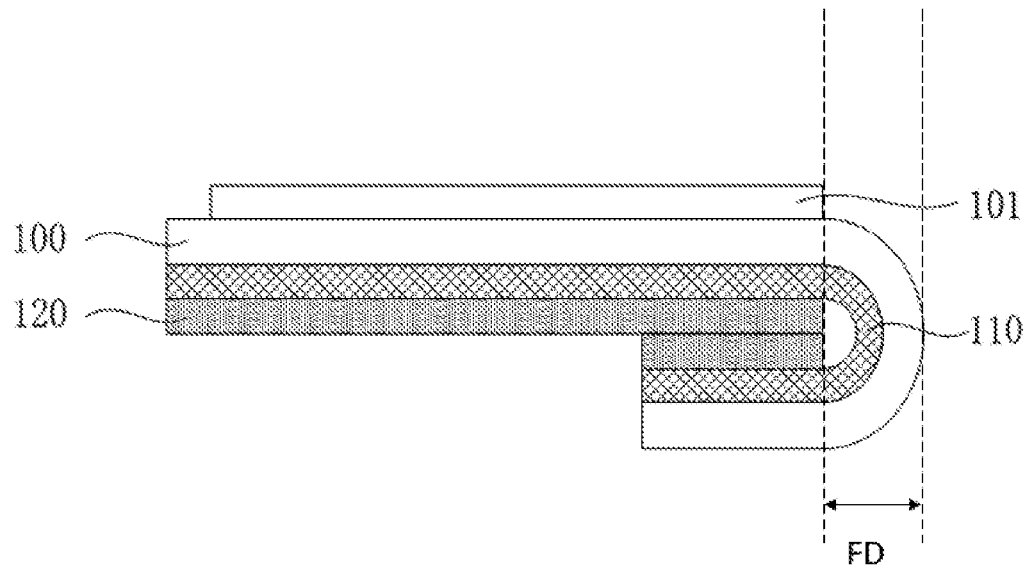
FIG. 7b illustrates a bending status of another exemplary flexible display panel in FIG. 7a consistent with disclosed embodiments.

FIG. 7a illustrates a top view of another exemplary flexible display panel consistent with disclosed embodiments. FIG. 7b illustrates a bending status of another exemplary flexible display panel in FIG. 7a consistent with disclosed embodiments. The similarities between FIGS. 7a-7b and FIGS. 1a-1b are not repeated here, while certain differences may be explained.

As shown in FIGS. 7a-7b, the folding area FD may be disposed between the bonding area BA and the display region AA. The bonding area BA may only include the wirings and circuits, but may not display any images, such that the bonding area BA may be covered by protective components (for example, a shell, a frame). The bonding area BA may have a polygonal shape, and extend along one side the display region AA.

The protective components are often made from a material having significantly larger rigidity than the flexible display panel, and the protective component may also restrict the design of the flexible display panel. In addition, the protective components may cause the display panel to be protruded from the surrounding environment, thereby degrading the user experience. Thus, the bonding area BA may be desired to be bent or folded outwards, such that the border area covering the bonding area BA may be reduced (i.e., narrowed) or eliminated (i.e., without a border).

However, when the first protective film 110 and the second protective film 120 sufficiently support and protect the flexible display panel, the superimposed rigidity of the first protective film 110 and the second protective film 120 may be substantially large. However, the area of the bonding area BA may be substantially small and, thus, when the flexible display panel is being bent, the electronic components in the bonding area BA may be likely to be peeled off or the display layer of the display region may be delaminated.

In the disclosed embodiments, the folding area FD may be disposed between the bonding area BA and the display region AA, the first protective film 110 may still cover the entire folding area FD, and the second protective film 120 may only cover the non-folding area NFD. That is, the first protective film 110 may still protect the entire display panel, while the second protective film 120 may only be attached to the display region AA and the bonding area BA. Thus, the display region AA and the bonding area BA may be better protected and, meanwhile, the folding area FD may exhibit a better bending performance than the display region AA and the bonding area BA. Accordingly, when the flexible display panel is bent outwards at the folding area FD, the display elements in the display region AA and the electronic components in the bonding area BA may not be affected.

Figure 8A:
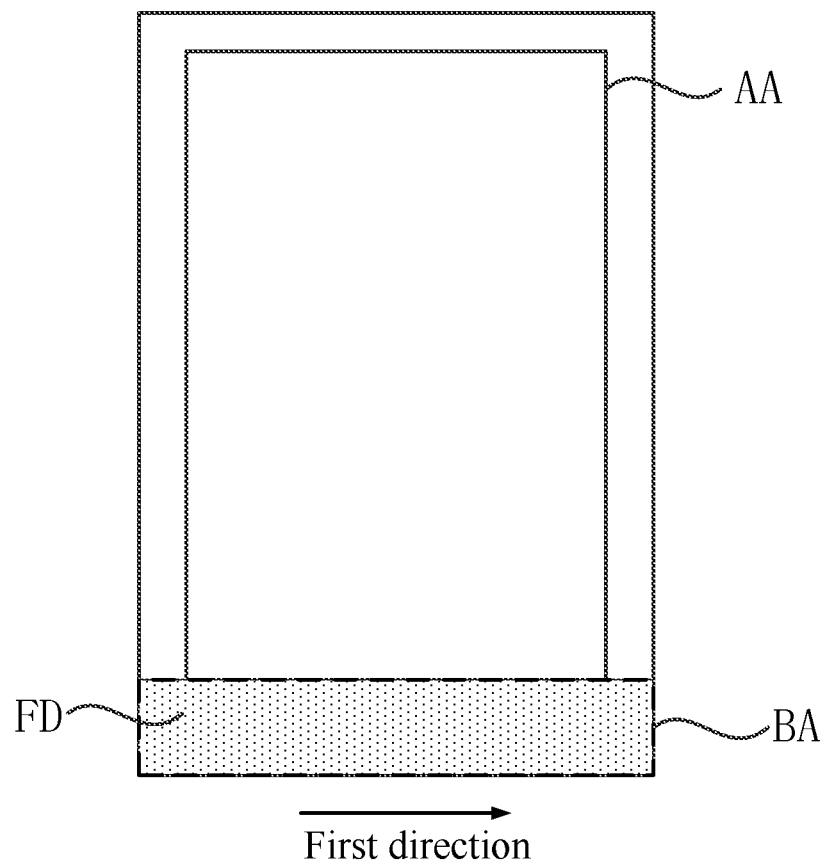
FIG. 8a illustrates a top view of another exemplary flexible display panel consistent with disclosed embodiments.
Figure 8B:
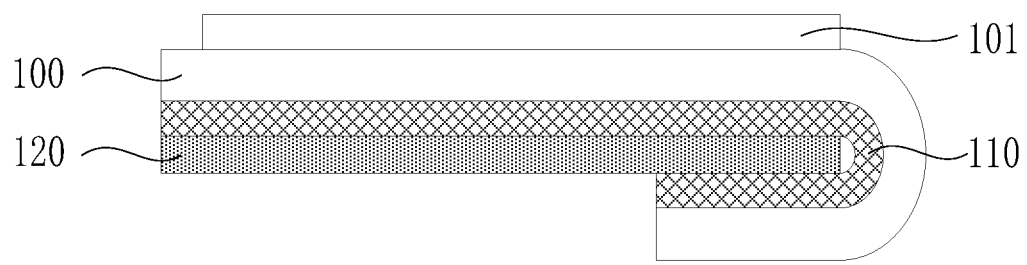
FIG. 8b illustrates a bending status of another exemplary flexible display panel in FIG. 8a consistent with disclosed embodiments.

FIG. 8a illustrates a top view of another exemplary flexible display panel consistent with disclosed embodiments. FIG. 8b illustrates a bending status of another exemplary flexible display panel in FIG. 8a consistent with disclosed embodiments. The similarities between FIGS. 8a-8b and FIGS. 7a-7b are not repeated here, while certain differences may be explained.

As shown in FIGS. 8a-8b, to realize a narrow lower border of the flexible display panel similar to FIGS. 7a-7b, the entire bonding area BA may be configured to be a folding area FD. That is, the second protective film 120 may only be attached to the display region AA, but not attached to the bonding area BA.

Compared to the flexible display panel in FIGS. 7a-7b, the folding region FD in FIGS. 8a-8b may have a smaller bending radius of curvature and a larger bending level, and a smaller thickness at an overlapping area of the bonding area BA after being bent and the display region AA.

Figure 9:
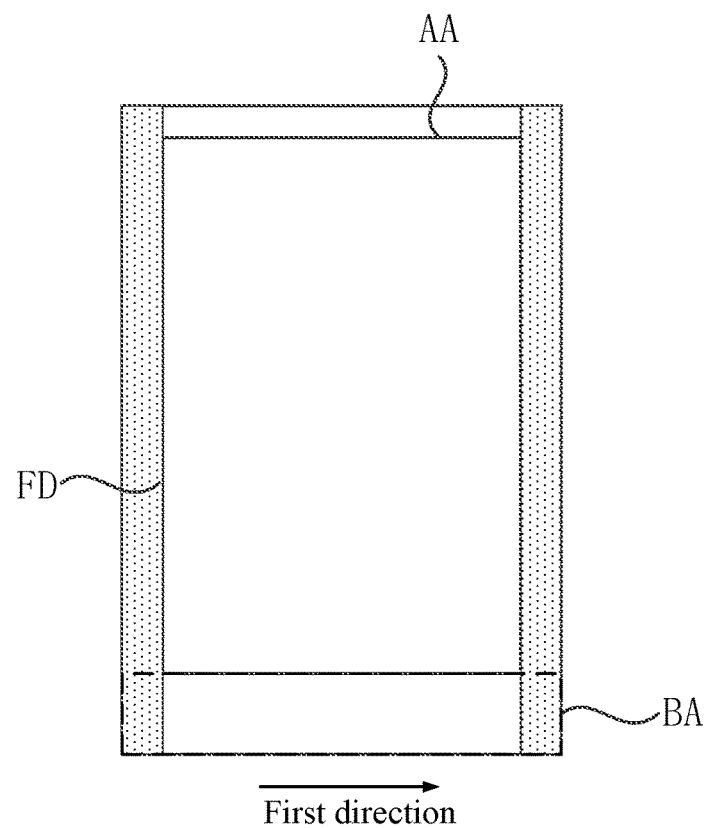
FIG. 9 illustrates a top view of another exemplary flexible display panel consistent with disclosed embodiments.

FIG. 9 illustrates a top view of another exemplary flexible display panel consistent with disclosed embodiments. The similarities between FIG. 9 and FIG. 7a are not repeated here, while certain differences may be explained.

As shown in FIG. 9, the non-display region may also include a frame area (or border area) FA located on each of two sides of the bonding area BA, in which the two sides of the bonding area BA are perpendicular to the first direction. The folding area FD may be configured to be the border area FA. When the folding area FD is located at the border area FA, a hyperboloid display panel may be realized, and the two border areas FA of the flexible display panel may be bent in a direction far away from the image displaying surface/side of the flexible display panel.

It should be noted that, the disclosed embodiments and the features of the disclosed embodiments shown in FIGS. 3a-9 may be combined under conditions without conflicts, and the derived embodiments consistent with the present disclosure are all within the scope of the present disclosure.

In the disclosed embodiments, the first protective film and the second protective film, as well as the first protective film and the flexible substrate may be bonded to each other through an adhesive layer. Corresponding structures are shown in FIG. 10 and FIGS. 11a-11b.

Figure 10:
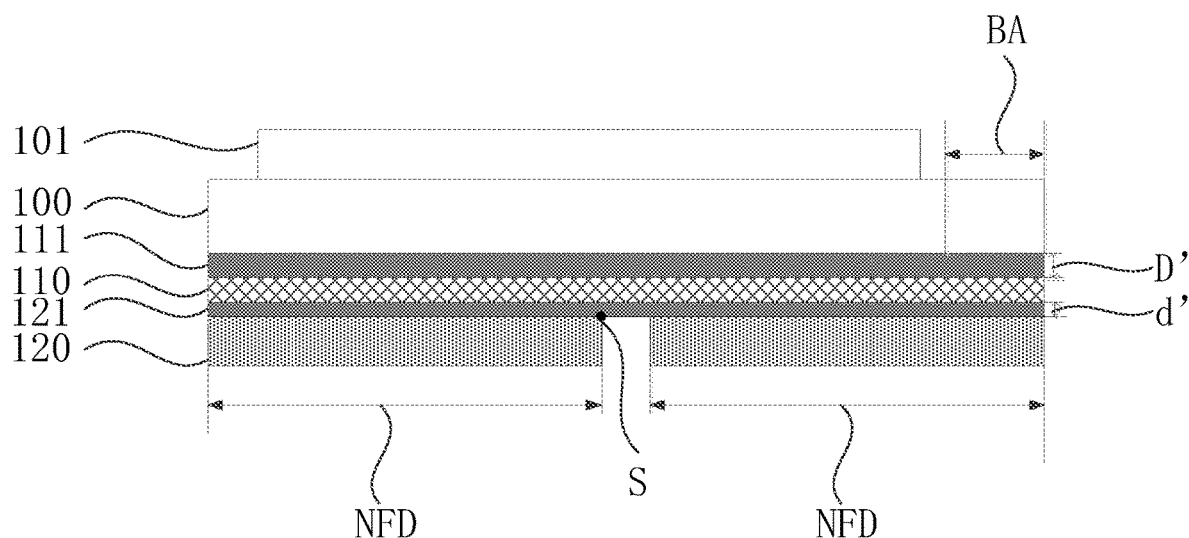
FIG. 10 illustrates a cross-sectional view of another exemplary flexible display panel consistent with disclosed embodiments.

FIG. 10 illustrates a cross-sectional view of another exemplary flexible display panel consistent with disclosed embodiments. As shown in FIG. 10, the first protective film 110 and the flexible substrate 100 may be bonded to each other by a first adhesive layer 111, and the second protective film 120 and the first protective film 110 may be bonded to each other by a second adhesive layer 121.

On one hand, the first adhesive layer 111 and the second adhesive layer 121 may bond the flexible substrate 100, the first protective film 110 and the second protective film 120 together. On the other hand, compared to the single protective film having different thickness in different regions of the single protective film, through disposing the second adhesive layer 121 between the first protective film 110 and the second protective film 120, the stress accumulated at the boundary of the first protective film 110 and the second protective film 120, thereby improving the bending reliability of the flexible display panel.

Figure 11A:
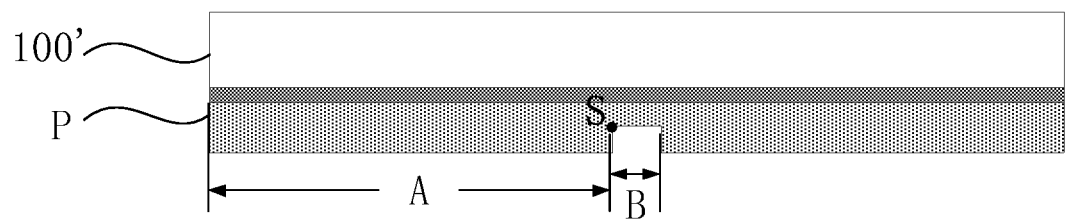
FIG. 11a illustrates a cross-sectional view of another exemplary flexible display panel consistent with disclosed embodiments.
Figure 11B:
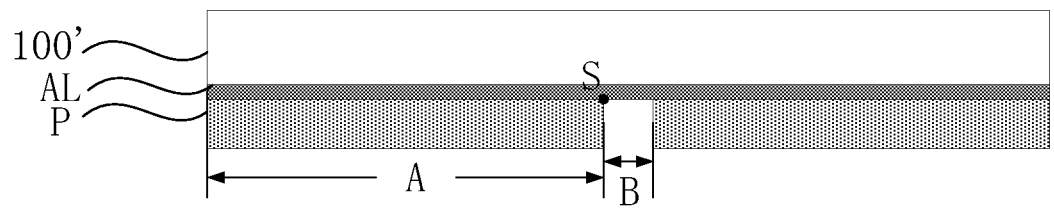
FIG. 11b illustrates a cross-sectional view of another exemplary flexible display panel consistent with disclosed embodiments.

FIG. 11a illustrates a cross-sectional view of another exemplary flexible display panel consistent with disclosed embodiments. FIG. 11b illustrates a cross-sectional view of another exemplary flexible display panel consistent with disclosed embodiments.

As shown in FIG. 11a, the flexible substrate 100' may be covered by a protective film P, which may have a different thickness in a first region A and a second region B. As shown in FIG. 11b, the flexible substrate 100' may be covered by a protective film P, which may be disconnected in the second region B, thereby directly exposing the adhesive layer AL or the flexible substrate 100' in the second region B to the outside.

As shown in FIGS. 11a-11b, a step S may be formed at the junction of the first region A and the second region B in the protective film P, and the step S may become a stress concentrated point. When the flexible display panel is subjected to a stress, cracks may be mainly generated in the stress concentrated point S, resulting a damage to the flexible display panel.

As compared to the flexible display panel in FIG. 11a, the flexible display panel in FIG. 10 may include two individual protective films 110 and 120, and the second adhesive layer 121 may be sandwiched between the first protective film 110 and the second protective film 120. The stress concentrated in the step S may be absorbed by the second adhesive layer 121, such that the stress penetrated to the first protective film 110 may be reduced. Then the first protective film 110 may further absorb the stress penetrated to the first protective film 110 and, thus, the flexible substrate 100 may be no longer subjected to the stress or may be subjected to significantly reduced stress. Accordingly, the flexible substrate may be effectively protected.

As a comparison, in FIG. 11b, the adhesive layer AL may still be disposed between the protective film P and the flexible substrate 100', however, the adhesive layer AL may be directly bonded to the flexible substrate 100'. Thus, the stress which is not completely absorbed may be applied to the flexible substrate 100' through penetrating the adhesive layer AL, and the protection of the flexible display panel may be rather limited. In addition, the area of the flexible display panel which is not covered by the protective film P may be directly exposed to the outside, and likely to be damaged by an external stress.

In the disclosed embodiments, the flexible display panel may be effectively protected and, meanwhile, the stress between the regionalized protective films and between the protective film and the flexible substrate may be effectively dispersed. In one embodiment, the second adhesive layer may be attached to the entire surface of the first protective film. In another embodiment, the second adhesive layer may be only attached to an overlapping area between the first and second protective films. When the second adhesive layer is only attached to an overlapping area between the first and second protective films, bending properties of the folding area may be further improved.

In one embodiment, the first adhesive layer may provide a larger adhesive force (i.e., adhesion) than the second adhesive layer. Because the second protective film may only cover the non-folding area, the second protective film may have a lower possibility to be bent than the folding region. Thus, a substantially adhesive force may not be desired between the second protective film and the first protective film. When the second adhesive layer has a larger adhesive force, the stress may be more concentrated under an external force. Through configuring the second adhesive layer to have a substantially low adhesive force, the stress may be reduced to be concentrated at the step S at the junction of the second protective film and the first protective film.

In one embodiment, the first adhesive layer may be configured to have a larger thickness than the second adhesive layer. Referring to FIG. 10, the thickness D' of the first adhesive layer may be larger than the thickness d' of the second adhesive layer. Through configuring the first adhesive layer and the second adhesive layer to have a different thickness, the adhesive force (i.e., adhesion) of the two adhesive layers may be adjusted respectively. When the adhesive layer has a larger thickness, the corresponding adhesive force may be larger. In one embodiment, the thickness of the second adhesive layer may be configured to be approximately 5 μm to 30 μm.

Figure 12:
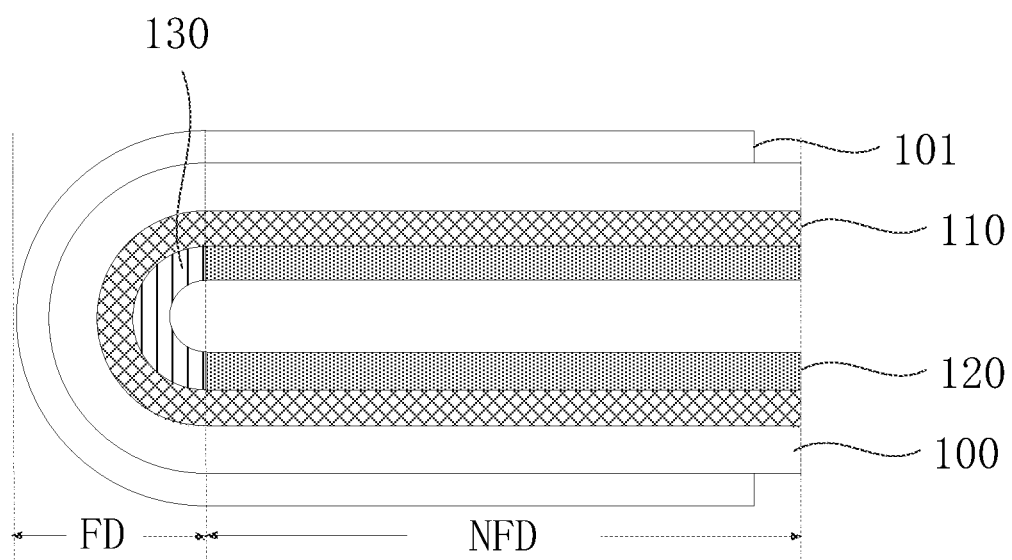
FIG. 12 illustrates a cross-sectional view of another exemplary flexible display panel consistent with disclosed embodiments.

FIG. 12 illustrates a cross-sectional view of another exemplary flexible display panel consistent with disclosed embodiments. The similarities between FIG. 12 and FIG. 3a are not repeated here, while certain differences may be explained.

A shown in FIG. 12, the first protective film 110 has a first surface facing the flexible substrate 100 and an opposite second surface far away from the flexible substrate 100. In the folding area FD, an elastic material 130 may be disposed on the second surface of the flexible substrate 100. In particular, the elastic material 130 may have a smaller elastic modulus than the first protective film 110 and the second protective film 120.

In the folding area FD, through disposing the elastic material 130, which has a smaller elastic modulus than the first protective film 110 and the second protective film 120, on the second surface of the flexible substrate 100, the overall elastic modulus of the folding area FD in the flexible display panel may be decreased, i.e., the elasticity of the folding area FD in the flexible display panel may be increased.

In addition, the elastic material 130 disposed on the second surface of the flexible substrate 100 may have a first surface facing the first protective film 110 and an opposite second surface. The second protective film 120 may have a first surface facing the first protective film 110 and an opposite second surface. In particular, the second surface of the elastic material 130 may be configured to be at the same level as the second surface of the second protective film 120, thereby increasing the flatness of the flexible display panel.

Figure 13:
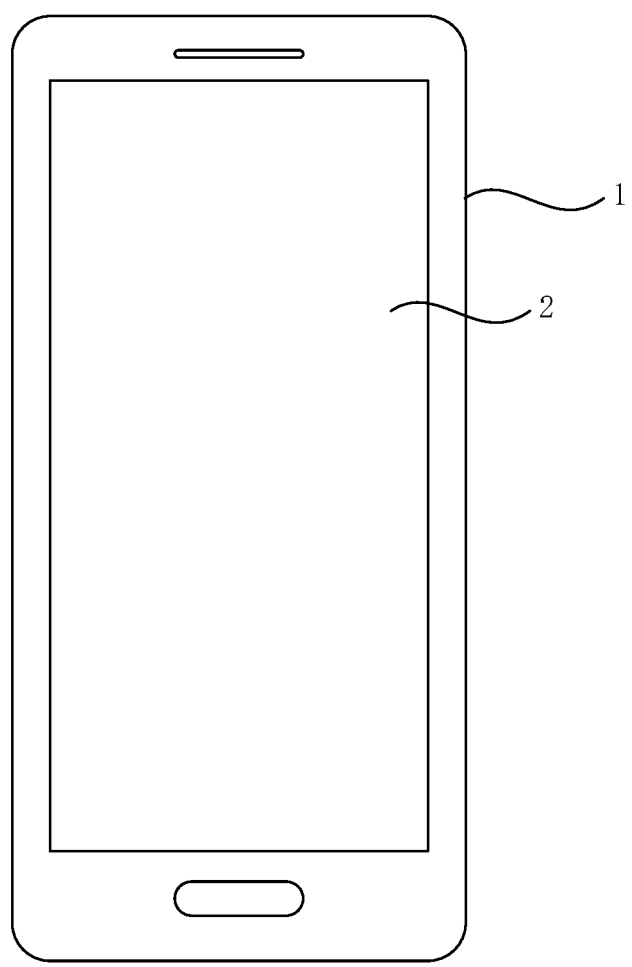
FIG. 13 illustrates an exemplary flexible display device consistent with disclosed embodiments.

The present disclosure also provides a flexible display device comprising any one of the disclosed flexible display panels. FIG. 13 illustrates an exemplary flexible display device consistent with disclosed embodiments.

As shown in FIG. 13 the flexible control display device 1 may comprise a flexible display panel 2, which may be any one of the disclosed flexible display panels. Because the flexible display device 1 comprises any one of the disclosed flexible display panels, the flexible display device 1 may also have the same advantages as the disclosed flexible display panels, which are not repeated here. The flexible display device 1 may be a smart phone, a tablet, and a wearable touch control display device, etc., which is not limited by the present disclosure.

In the disclosed embodiments, the flexible substrate may have a first surface and an opposite second surface, the light-emitting unit may be formed on the first surface of the flexible substrate, and the first protective film and the second protective film may be formed on the second surface of the flexible substrate. Through disposing the first protective film and the second protective film on the second surface of the flexible substrate, the local flexibility and rigidity of the flexible display panel may be adjusted as desired.

In particular, the first protective film may cover the entire flexible substrate, while the second protective film may only cover the non-folding area of the flexible display panel. That is, the folding area of the flexible display panel may be covered and supported by the first protective film only, while the non-folding area of the flexible display panel may be covered by both the first protective film and second protective film. Thus, the folding area may exhibit a larger flexibility than the non-folding area, allowing the flexible display panel to be bent at the folding area, while the non-folding area may exhibit a larger rigidity than the folding area, providing a better protection of the internal components.

Further, the dual-protective-film structure may simplify the fabrication process of the protective films, and provide a high flexibility in arranging the protective films, which may be applicable to a flexible display panel with any desired bending requirements.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A flexible display panel, comprising:
 a display region and a non-display region surrounding the display region, wherein the non-display region includes a bonding area;
 a flexible substrate having a first surface and an opposite second surface;
 an array substrate comprising a thin-film-transistor (TFT) array on the first surface of the flexible substrate;
 a light-emitting unit formed on a surface of the thin-film transistor array away from the flexible substrate;
 a first protective film formed on the second surface of the flexible substrate and covering the entire second surface of the flexible substrate, wherein the first protective film has a first side facing the flexible substrate and an opposite second side away from the flexible substrate;
 a second protective film formed on the second side of the first protective film;
 a first adhesive layer on one side of the first protective film adjacent to the flexible substrate for bonding the first protective film with the flexible substrate; and
 a second adhesive layer on the other side of the first protective film away from the first adhesive layer for bonding the first protective film with the second protective film, and in direct contact with the first and the second protective films,
 wherein the flexible display panel includes at least one folding area and at least one non-folding area,
 the second protective film only covers the at least one non-folding area,
 the second adhesive layer covers the at least one folding area and the at least one non-folding area of the first protective film and includes a portion, in the at least one folding area, that is uncovered by the second protective film,
 the first adhesive layer has a larger adhesive force than the second adhesive layer, and
 the first adhesive layer has a larger thickness than the second adhesive layer.

2. The flexible display panel according to claim 1, wherein:
 a thickness of the second protective film is larger than a thickness of the first protective film.

3. The flexible display panel according to claim 2, wherein:
 the thickness of the first protective film is approximately 10 μm to 30 μm; and
 the thickness of the second protective film is approximately 50 μm to 100 μm.

4. The flexible display panel according to claim 1, wherein:
 an elastic modulus of the second protective film is larger than an elastic modulus of the first protective film.

5. The flexible display panel according to claim 4, wherein:
 the elastic modulus of the first protective film is approximately 100 Mpa to 10 Gpa; and
 the elastic modulus of the second protective film is approximately 1 Gpa-20 Gpa.

6. The flexible display panel according to claim 1, wherein:
 the at least one folding area is arranged across the flexible display panel in a first direction,
 wherein the first direction is located in a same plane as the flexible display panel.

7. The flexible display panel according to claim 6, wherein:
 the at least one folding area has a rectangular shape.

8. The flexible display panel according to claim 7, wherein:
 the first direction is same as an extending direction of a gate line of the flexible display panel, and
 one side of the rectangular shape extends in the first direction.

9. The flexible display panel according to claim 7, wherein:
 the flexible display panel includes at least two folding areas; and
 the at least two folding areas and the at least one non-folding area are alternately arranged in a direction perpendicular to the first direction.

10. The flexible display panel according to claim 9, wherein:
 the flexible display panel includes two folding areas having different widths in the direction perpendicular to the first direction.

11. The flexible display panel according to claim 10, wherein:
 in the direction perpendicular to the first direction, the two folding areas have a width of $\pi r$ and $\pi R$, respectively, where r and R are bending radii of curvature of the flexible display panel at the two folding areas, respectively.

12. The flexible display panel according to claim 1, wherein:
 the at least one folding area is the bonding area.

13. The flexible display panel according to claim 1, wherein:
 the at least one folding area is a region between the bonding area and the display region.

14. The flexible display panel according to claim 1, wherein:
 the non-display region further includes frame areas located on both sides of the bonding area, respectively; and
 the frame area is a folding area.

15. The flexible display panel according to claim 1, wherein:
 a thickness of the first protective film and a thickness of the second protective film are adjusted to change flexibility of the at least one non-folding area and the at least one folding area.

16. The flexible display panel according to claim 1, wherein:
 the first protective film and the second protective film each includes an organic material, wherein the organic material includes at least one of polyethylene terephthalate, polyethylene naphthalate and polyethylene.

17. A flexible display device, comprising:
a flexible display panel, comprising:
- a display region and a non-display region surrounding the display region, wherein the non-display region includes a bonding area;
- a flexible substrate having a first surface and an opposite second surface;
- an array substrate comprising a thin-film-transistor (TFT) array on the first surface of the flexible substrate;
- a light-emitting unit formed on a surface of the thin-film transistor array away from the flexible substrate;
- a first protective film formed on the second surface of the flexible substrate and covering the entire second surface of the flexible substrate, wherein the first protective film has a first side facing the flexible substrate and an opposite second side away from the flexible substrate;
- a second protective film formed on the second side of the first protective film;
- a first adhesive layer on one side of the first protective film adjacent to the flexible substrate for bonding the first protective film with the flexible substrate; and
- a second adhesive layer on the other side of the first protective film away from the first adhesive layer for bonding the first protective film with the second protective film, and in direct contact with the first and the second protective films,
- wherein the flexible display panel includes at least one folding area and at least one non-folding area,
- the second protective film only covers the at least one non-folding area,
- the second adhesive layer covers the at least one folding area and the at least one non-folding area of the first protective film and includes a portion, in the at least one folding area, that is uncovered by the second protective film,
- the first adhesive layer has a larger adhesive force than the second adhesive layer, and
- the first adhesive layer has a larger thickness than the second adhesive layer.

18. A flexible display panel, comprising:
- a display region and a non-display region surrounding the display region, wherein the non-display region includes a bonding area;
- a flexible substrate having a first surface and an opposite second surface;
- an array substrate comprising a thin-film-transistor (TFT) array on the first surface of the flexible substrate;
- a light-emitting unit formed on a surface of the thin-film transistor array away from the flexible substrate;
- a first protective film formed on the second surface of the flexible substrate and covering the entire second surface of the flexible substrate, wherein the first protective film has a first side facing the flexible substrate and an opposite second side away from the flexible substrate;
- a second protective film formed on the second side of the first protective film;
- a first adhesive layer on one side of the first protective film adjacent to the flexible substrate for bonding the first protective film with the flexible substrate; and
- a second adhesive layer on the other side of the first protective film away from the first adhesive layer for bonding the first protective film with the second protective film, and in direct contact with the first and the second protective films,
- wherein the flexible display panel includes at least one folding area and at least one non-folding area,
- the second protective film only covers the at least one non-folding area, and
- an elastic material is disposed on a portion of a surface of the first protective film, on the other side of the first protective film away from the first adhesive layer, not covered by the second protective film in the at least one folding area, the elastic material having a smaller elastic modulus than the first protective film and the second protective film to increase elasticity of the at least one folding area, and a surface of the elastic material away from the first protective film being configured to be at a same level as a surface of the second protective film away from the first protective film to increase a flatness of the flexible display panel.

* * * * *